United States Patent
Park et al.

(10) Patent No.: US 9,922,840 B2
(45) Date of Patent: Mar. 20, 2018

(54) ADJUSTABLE REMOTE DISSOCIATION

(71) Applicant: Applied Materials, Inc., Santa Clara, CA (US)

(72) Inventors: Soonam Park, Sunnyvale, CA (US); Kenneth D. Schatz, Los Altos, CA (US); Soonwook Jung, Sunnyvale, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/793,508

(22) Filed: Jul. 7, 2015

(65) Prior Publication Data
US 2017/0011931 A1    Jan. 12, 2017

(51) Int. Cl.
| | |
|---|---|
| H01L 21/311 | (2006.01) |
| H01L 21/3065 | (2006.01) |
| H01L 21/3213 | (2006.01) |
| H01J 37/32 | (2006.01) |
| H01L 21/67 | (2006.01) |

(52) U.S. Cl.
CPC .... *H01L 21/31116* (2013.01); *H01J 37/3244* (2013.01); *H01J 37/32357* (2013.01); *H01L 21/3065* (2013.01); *H01L 21/31138* (2013.01); *H01L 21/31144* (2013.01); *H01L 21/32136* (2013.01); *H01L 21/67069* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,576,151 B1 | 6/2003 | Vereecke et al. | |
| 8,211,808 B2 | 7/2012 | Sapre et al. | |
| 8,435,902 B2 | 5/2013 | Jing et al. | |
| 8,642,481 B2 | 2/2014 | Yunyu et al. | |
| 8,956,980 B1* | 2/2015 | Chen | H01L 21/31116 216/79 |
| 2006/0065367 A1* | 3/2006 | Chen | H01J 37/32082 156/345.33 |
| 2009/0017227 A1 | 1/2009 | Fu et al. | |
| 2011/0165347 A1 | 7/2011 | Miller et al. | |

(Continued)

FOREIGN PATENT DOCUMENTS

KR    10-2014-0065369 A    5/2014

*Primary Examiner* — Jiong-Ping Lu
(74) *Attorney, Agent, or Firm* — Kilpatrick Townsend & Stockton LLP (57) ABSTRACT

Methods of selectively etching an exposed portion of a patterned substrate relative to a second exposed portion are described. The etching process is a gas phase etch which uses an oxidizing precursor unexcited in any plasma prior to combination with plasma effluents formed in a remote plasma from an inert precursor. The plasma effluents may be combined with the oxidizing precursor in a plasma-free remote chamber region and/or in a plasma-free substrate processing region. The combination of the plasma effluents excites the oxidizing precursor and removes material from the exposed portion of the patterned substrate. The etch rate is controllable and selectable by adjusting the flow rate of the oxidizing precursor or the unexcited/plasma-excited flow rate ratio.

11 Claims, 6 Drawing Sheets

(56) References Cited

U.S. PATENT DOCUMENTS

| | | | |
|---|---|---|---|
| 2011/0266252 A1 | 11/2011 | Thadani et al. | |
| 2011/0294300 A1 | 12/2011 | Zhang et al. | |
| 2012/0009796 A1 | 1/2012 | Cui et al. | |
| 2012/0196447 A1 | 8/2012 | Yang et al. | |
| 2012/0211462 A1* | 8/2012 | Zhang | H01L 21/31116 216/13 |
| 2012/0238108 A1 | 9/2012 | Chen et al. | |
| 2013/0034968 A1 | 2/2013 | Zhang et al. | |
| 2013/0045605 A1 | 2/2013 | Wang et al. | |
| 2013/0052827 A1 | 2/2013 | Wang et al. | |
| 2013/0089988 A1 | 4/2013 | Wang et al. | |
| 2014/0054269 A1* | 2/2014 | Hudson | H01J 37/32091 216/67 |
| 2014/0166617 A1 | 6/2014 | Chen et al. | |
| 2014/0251953 A1 | 9/2014 | Winkler | |
| 2014/0251954 A1 | 9/2014 | Winkler | |
| 2014/0302681 A1* | 10/2014 | Paterson | H01L 21/3065 438/710 |
| 2015/0132968 A1 | 5/2015 | Ren et al. | |

\* cited by examiner

ADJUSTABLE REMOTE DISSOCIATION

FIELD

Embodiments disclosed herein relate to remote plasma etch processes.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a photoresist pattern into underlying layers, thinning layers or thinning lateral dimensions of features already present on the surface. Often it is desirable to have an etch process which etches one material faster than another helping e.g. a pattern transfer process proceed. Such an etch process is said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. Remote excitation of etchants in a remote plasma system (instead of locally) may desirably increase selectivity.

In part, methods are needed to further increase selectivity especially when using off-the-shelf remote plasma hardware.

SUMMARY

Methods of selectively etching an exposed portion of a patterned substrate relative to a second exposed portion are described. The etching process is a gas phase etch which uses an oxidizing precursor (e.g. a halogen-containing precursor) which does not pass through the remote plasma. Instead, inert species are excited in a remote plasma to form first plasma effluents. The first plasma effluents may interact with the oxidizing precursor in a remote chamber region and form second plasma effluents. The second plasma effluents may then be passed through a showerhead into a substrate processing region to remove material from the exposed portion of the patterned substrate. The remote chamber region and the substrate processing region may be plasma-free during the etching processes described herein. Alternatively, the oxidizing precursor may enter the substrate processing region directly and the first plasma effluents are passed through a showerhead into the substrate processing region where combination occurs. Thus, the mixing may occur in the substrate processing region according to embodiments.

Embodiments disclosed herein include methods of etching a patterned substrate. The methods include placing the patterned substrate in a substrate processing region of a substrate processing chamber. The patterned substrate includes a first exposed portion and a second exposed portion. The methods further include flowing an first inert gas and a first oxidizing precursor into a remote plasma region fluidly coupled to the substrate processing region while forming a remote plasma in the remote plasma region to produce plasma effluents. The methods further include combining the plasma effluents with a second inert gas and a second oxidizing precursor. The methods further include etching the first exposed portion with the combination of the plasma effluents, the second inert gas and the second oxidizing precursor. The first exposed portion etches at a first etch rate and the second exposed portion etches at a second etch rate which is lower than the first etch rate.

Embodiments disclosed herein include methods of etching a patterned substrate. The methods include placing the patterned substrate in a substrate processing region of a substrate processing chamber. The patterned substrate includes a first exposed portion and a second exposed portion. The methods further include flowing an inert gas into a remote plasma system outside the substrate processing chamber and fluidly coupled to a remote chamber region within the substrate processing chamber. The methods further include forming a remote plasma in the remote plasma system to produce plasma effluents. The methods further include flowing the plasma effluents into the remote chamber region. The methods further include flowing an oxidizing precursor into the remote chamber region. The methods further include etching the first exposed portion with the combination of the plasma effluents and the inert gas. The first exposed portion etches at a first etch rate and the second exposed portion etches at a second etch rate which is lower than the first etch rate.

Embodiments disclosed herein include methods of etching a patterned substrate. The methods include placing the patterned substrate in a substrate processing region of a substrate processing chamber. The patterned substrate includes a first exposed portion and a second exposed portion. The methods further include flowing an inert gas into a remote plasma region fluidly coupled to the substrate processing region while forming a remote plasma in the remote plasma region to produce plasma effluents. The methods further include combining the plasma effluents with a halogen-containing precursor in the substrate processing region. The methods further include etching the first exposed portion with the combination of the plasma effluents and the halogen-containing precursor. The first exposed portion etches at a first etch rate and the second exposed portion etches at a second etch rate which is lower than the first etch rate.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of selectively etching an exposed portion of a patterned substrate relative to a second exposed portion are described. The etching process is a gas phase etch which uses an oxidizing precursor (e.g. a halogen-containing precursor) which does not pass through the remote plasma. Instead, inert species are excited in a remote plasma to form first plasma effluents. The first plasma effluents may interact with the oxidizing precursor in a remote chamber region and form second plasma effluents. The second plasma effluents may then pass through a showerhead into a substrate processing region to remove material from the exposed portion of the patterned substrate. The remote chamber region and the substrate processing region may be plasma-free during the etching processes described herein. Alternatively, the oxidizing precursor may enter the substrate processing region directly and the first plasma effluents are passed through a showerhead into the substrate processing region where combination occurs.

In the past, remote gas phase etch processes have excited $NF_3$ in a remote plasma and flowed the plasma effluents into a substrate processing region. In those processes, additional gases have been added to the remote plasma and/or downstream of the remote plasma to customize the selectivity. Selecting a desirable plasma power has been difficult using some remote plasma hardware (e.g. inductively-coupled plasma hardware). High plasma powers are desirable for chamber cleaning recipes but much lower powers are needed for patterned substrate processing (a far more sensitive operation). A benefit of the etch processes described herein involves a reduction in etch rate and also a reduction in plasma power which increases component longevity. The remote plasma gas phase etch processes described herein remove one substrate portion much more rapidly than another substrate portion at a well-controlled and selectable etch rate.

Figure 1:
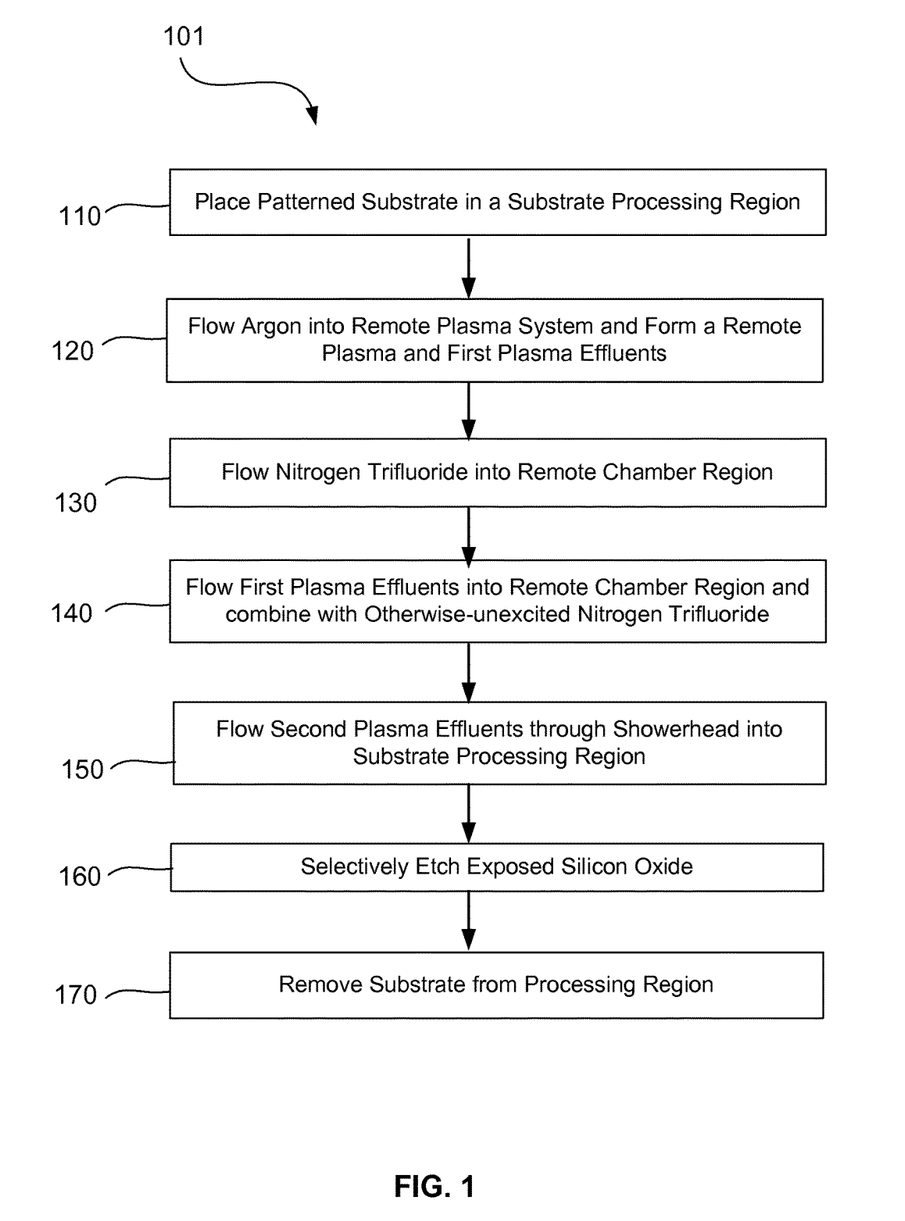
FIG. 1 is a flow chart of a silicon oxide selective etch process according to embodiments.

To better understand and appreciate the embodiments disclosed herein, reference is now made to FIG. 1 which is a flow chart of a silicon oxide selective etch process 101 according to embodiments. Prior to the first operation, the substrate is patterned and an exposed silicon oxide portion is formed on the patterned substrate. An exposed silicon nitride portion is also formed on the patterned substrate. The patterned substrate is then placed within the substrate processing region in operation 110.

An inert gas (e.g. Argon) may be flowed into a remote plasma system (RPS) in operation 120. The RPS may contain only inert gases during selective etch 101 in embodiments. The inert may be excited in a remote plasma formed in the remote plasma system. The remote plasma system is located outside the substrate processing chamber and fluidly coupled through a manifold to a remote chamber region within the substrate processing chamber. An oxidizing precursor (e.g. $NF_3$) is flowed into the remote chamber region in operation 130. The remote chamber region may be plasma-free in this exemplary embodiment. The first plasma effluents formed in the remote plasma system are flowed through the manifold into the remote chamber region and combined with the oxidizing precursor in operation 140. The first plasma effluents provide the dominant or only excitation to the oxidizing precursor according to embodiments. The oxidizing precursor is not directly excited by any plasma prior to being combined with the first plasma effluents in embodiments. The combination of the oxidizing precursor and the first plasma effluents form "second" plasma effluents which are flowed into the substrate processing region by way of a showerhead in operation 150. The exposed silicon oxide portion is selectively etched in operation 160. The reactive chemical species are removed and the substrate is removed from the substrate processing region (operation 170).

Generally speaking, the oxidizing precursor may comprise at least one of a halogen or oxygen in embodiments in embodiments. The oxidizing precursor may be a halide. The oxidizing precursor may increase the valence of an exposed element of the exposed portion of the patterned substrate. The inert gas may comprise a noble gas or a gas which forms no covalent bonds at the surface of the patterned substrate during the process according to embodiments. In embodiments where the oxidizing precursor is a halogen-containing precursor, the halogen-containing precursor may comprise a precursor selected from the group consisting of Cl, $Cl_2$, F, $F_2$, $NF_3$, $CF_4$, HF and $XeF_2$. In embodiments where the oxidizing precursor is an oxygen-containing precursor, the oxygen-containing precursor may comprise one or more of $O_2$, $O_3$, $N_2O$, $H_2O$, $NO_2$ and $N_2O_2$.

The remote plasma region may be within a distinct module (the RPS) separate from but generally affixed to the substrate processing chamber as in selective etch process 101. The oxidizing precursor may be flowed into the manifold, into the remote chamber region or directly into the substrate processing region according to embodiments. On the other hand, the remote plasma region may be the remote chamber region separated from the substrate processing region by the showerhead. The oxidizing precursor may then flow directly into the substrate processing region, in embodiments, to avoid being excited by the plasma in the remote chamber region. Lastly, the remote plasma region may include both the RPS and the remote chamber region, in embodiments, and the oxidizing precursor may flow directly into the substrate processing region in this case as well.

In some embodiments, the remote plasma region may be devoid of halogens and/or devoid of oxygen during the operation of etching the first exposed portion. The remote plasma region may contain only inert gases in embodiments. In this case, the reactive species which remove material from the first exposed portion of the patterned substrate are only excited by plasma effluents and not directly in any plasma.

According to embodiments, a combination of a first inert gas and a first oxidizing precursor may be flowed into the remote plasma region to form plasma effluents. A combination of a second inert gas and a second oxidizing precursor may be flowed into either the remote chamber region or the substrate processing region without first passing through any plasma according to embodiments. The proportions of inert gases and oxidizing precursors and the ratio of the first flow to the second flow determine the etch rate of the exposed portion of the patterned substrate. The ratio of the first inert gas to the first oxidizing precursor may be the same as the ratio of the second inert gas to the second oxidizing precursor according to embodiments. The same ratio enables a common source to be used to create the first flow rate and the second flow rate. In embodiments, the ratio of the first flow rate to the second flow rate is determined by a single valve which simply directs a selectable portion of a constant flow rate into the remote plasma region and the remaining portion into the substrate processing region or plasma-free remote chamber region as appropriate.

The first inert gas and/or the second inert gas are one of neon, argon, helium, a noble gas or $N_2$ in embodiments. The first inert gas and/or the second inert gas may include argon and helium in an embodiment. The first oxidizing precursor and/or the second oxidizing precursor may comprise a halogen according to embodiments. The first oxidizing precursor and/or the second oxidizing precursor may comprise oxygen in embodiments. The first oxidizing precursor and/or the second oxidizing precursor may comprise one or more of $O_2$, $O_3$, $N_2O$, $H_2O$, $NO_2$ and $N_2O_2$ according to embodiments. The first oxidizing precursor and/or the second oxidizing precursor may comprise one or more of Cl, $Cl_2$, F, $F_2$, $NF_3$, $CF_4$, HF and $XeF_2$ in embodiments. The first oxidizing precursor and/or the second oxidizing precursor may comprise hydrogen but may be oxygen-free and halogen-free in embodiments. The first oxidizing precursor and/or the second oxidizing precursor may comprise one or more of $H_2$ and $NH_3$ according to embodiments.

Figure 2:
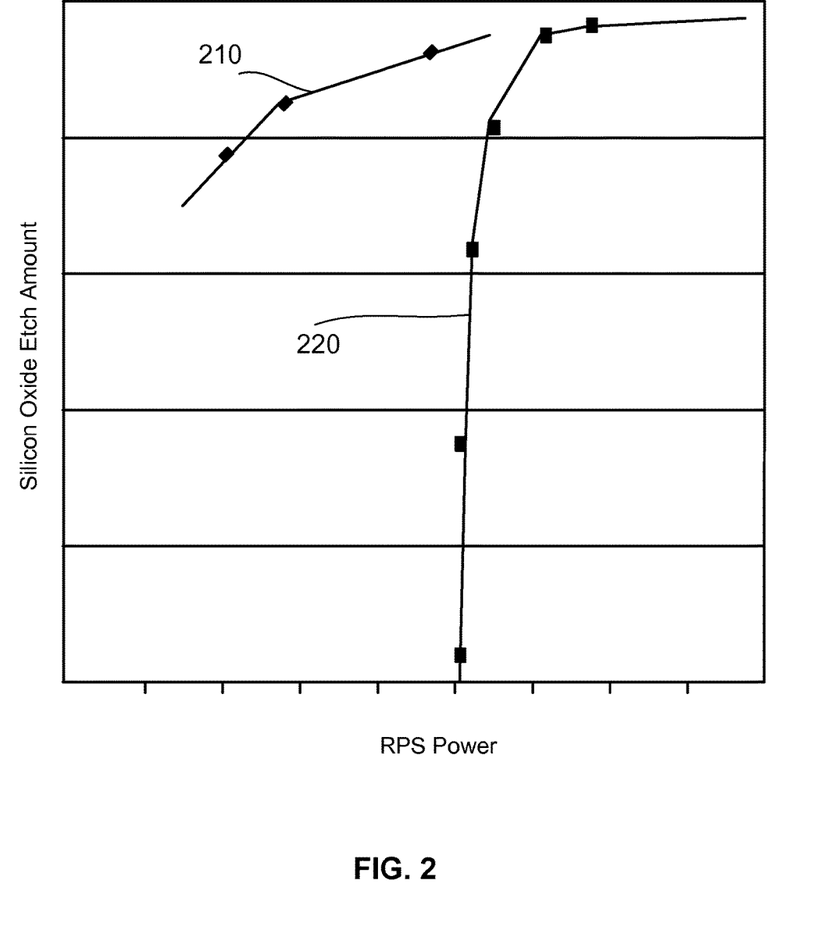
FIG. 2 is a plot of silicon oxide etch amount according to embodiments.

Reference is now made to FIG. 2 which is a plot of silicon oxide etch amount during silicon oxide etch processes including selective etch process 101 according to embodiments. Varying the plasma current (210) results in a relatively small change in silicon oxide etch amount. As a result, the plasma current is not an ideal way to reduce the etch rate of exposed material on the patterned substrate. A benefit of the methods presented herein is that the etch rate may be well controlled even at low etch rates. Front-end etch processes, for example, often benefit from very low etch rates since the features are exceedingly small. FIG. 2 shows how the etch rate may be reduced (220) by reducing a flow rate of oxidizing precursor into the remote chamber region or the substrate processing region. The flow rate is reduced without significantly reducing the RPS power. A further benefit of the processes presented herein is that the remote plasma is more stable than alternative methods of controllably reducing the etch rate of exposed portions of the patterned substrate. Optical emission spectroscopy was used to determine that varying the flow rate or flow rate ratio varied the atomic fluorine concentration which was found to be proportional to the etch rate of the first exposed portion of the patterned substrate.

The illustrative example represented by FIGS. 1 and 2 used a patterned substrate having a first exposed portion of silicon oxide and a second exposed portion of silicon nitride. Generally speaking, the methods presented herein may be used to selectively etch a first exposed portion faster than a second exposed portion which simply has a differing atomic stoichiometry (a different ratio of atomic concentrations) which includes having different atomic components altogether. The first exposed portion contains at least one element not present in the second exposed portion in embodiments. The second exposed portion contains at least one element not present in the first exposed portion according to embodiments. The first etch rate may be used to describe the etch rate of the first exposed portion and the second etch rate may be used to describe the etch rate of the second exposed portion of the alternative material. The first etch rate may exceed the second etch rate by a factor of more than 80, more than 120 or more than 150 in embodiments.

The pressure in the substrate processing region and the remote plasma region(s) during the etching operations may be between 0.1 Torr and 50 Torr, between 1 Torr and 15 Torr or between 5 Torr and 10 Torr in embodiments. The temperature of the patterned substrate during the etching operations may be between −20° C. and 450° C., between 0° C. and 350° C. or between 5° C. and 200° C. in embodiments. The methods described herein have resulted in a reproducible and selectable etch amount of between 0 Å and 300 Å.

The method also includes applying power to the inert gas during operation 120 in the remote plasma region(s) to generate the plasma effluents. The plasma parameters described herein apply to remote plasmas used to etch the patterned substrate. As would be appreciated by one of ordinary skill in the art, the plasma may include a number of charged and neutral species including radicals and ions. The plasma may be generated using known techniques (e.g., RF, capacitively coupled, inductively coupled). In an embodiment, the remote plasma power may be applied to the remote plasma region at a level between 25 W and 2 kW. All power ranges presented herein apply for a remote plasma region which is an RPS or a chamber plasma region. The relatively low plasma powers described herein may provide the benefits of greater longevity of chamber parts and also a reduction in power used/heat generated during etching operations. The remote plasma power may be applied using toroidal coils or inductive coils, in embodiments, in which case the remote plasma will be referred to as an inductively-coupled plasma (ICP) or may be applied using capacitive plates, in which case the remote plasma will be referred to as a capacitive-coupled plasma (CCP). Other possible plasma parameters and ranges will be described along with exemplary equipment herein.

In embodiments, an ion suppressor (which may be the showerhead) may be used to provide radical and/or neutral species for gas-phase etching. The ion suppressor may also be referred to as an ion suppression element and may be positioned between the remote chamber region and the substrate processing region along with the showerhead. In embodiments, for example, the ion suppressor is used to filter etching plasma effluents en route from the remote plasma region(s) to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the gas-phase etch processes described herein.

In embodiments, an electron beam is passed through the substrate processing region in a plane parallel to the substrate to reduce the electron temperature of the plasma effluents. A simpler showerhead may be used if an electron beam is applied in this manner. The electron beam may be passed as a laminar sheet disposed above the substrate in embodiments. The electron beam provides a source of neutralizing negative charge and provides a more active means for reducing the flow of positively charged ions towards the substrate and increasing the etch selectivity in embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. In all plasma-free regions described herein (especially in the substrate processing region), the electron temperature may be less than 0.5 eV, less than 0.45 eV, less than 0.4 eV, or less than 0.35 eV. These extremely low values for the electron temperature are enabled by the presence of the electron beam, showerhead and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments disclosed herein are also advantageous over conventional wet etch processes where surface tension of liquids can cause bending and peeling of small features.

The substrate processing region may be described herein as "plasma-free" during the etch processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the remote plasma region (e.g. the remote chamber region and/or the remote plasma region) may encroach to some small degree upon the substrate processing region through the apertures in the showerhead. Furthermore, a low intensity plasma may be created in the substrate processing region without eliminating desirable features of the etch processes described herein. All causes for a plasma having much lower intensity ion density than the remote plasma region during the creation of the excited plasma effluents do not deviate from the scope of "plasma-free" as used herein. The remote chamber region may have remote plasma within or may be plasma-free, in which case, a remote plasma system may be used to provide the remote excitation of the inert gas.

Figure 3A:
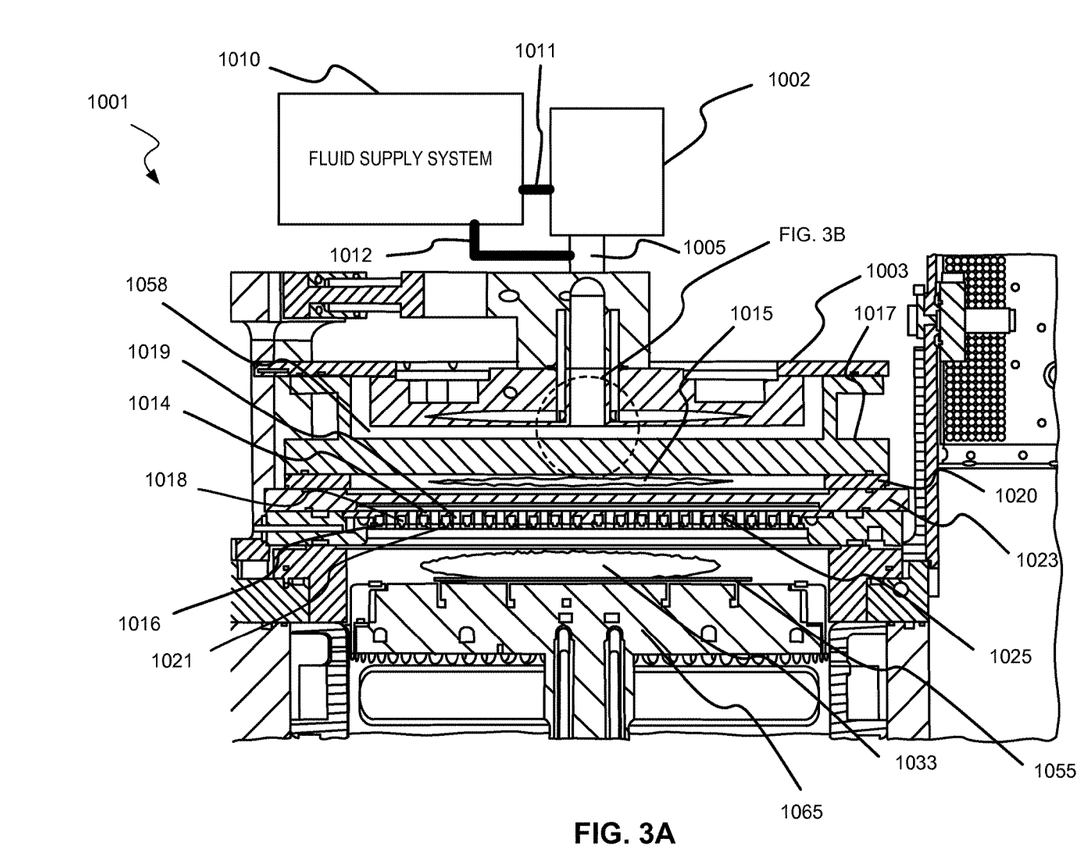
FIG. 3A shows a schematic cross-sectional view of a substrate processing chamber according to embodiments.

FIG. 3A shows a cross-sectional view of an exemplary substrate processing chamber 1001 with a partitioned region within substrate processing chamber 1001. The partitioned region will be referred to herein as a remote chamber region owing to the partitioning relative to substrate processing region 1033. A remote plasma system (RPS) 1002 may be present on and external to substrate processing chamber 1001 as shown. RPS 1002 may be used to excite an inert gas supplied through inert supply line 1011. The plasma effluents formed in RPS 1002 then travel into effluent mixing region 1005 and combine with an oxidizing precursor supplied through oxidizing precursor supply line 1012.

A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Effluent mixing region 1005 opens into a gas supply region 1058 partitioned from the remote chamber region 1015 by faceplate 1017 so that the gases/species flow through the holes in the faceplate 1017 into the remote chamber region 1015. Structural and operational features may be selected to prevent significant backflow of plasma from the remote chamber region 1015 back into gas supply region 1058, effluent mixing region 1005, and fluid supply system 1010. The structural features may include the selection of dimensions and cross-sectional geometries of the apertures in faceplate 1017 to deactivate back-streaming plasma in cases where a plasma is generated in remote chamber region 1015. The operational features may include maintaining a pressure difference between the gas supply region 1058 and remote chamber region 1015 that maintains a unidirectional flow of plasma effluents through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the remote chamber region. Remote chamber region 1015 may be referred to as a chamber plasma region when used to form the remote plasma. However, no plasma is present in remote chamber region 1015 in embodiments. The inert gas may only be excited in RPS 1002 according to embodiments.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces remote chamber region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor. The ion suppression element 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the remote plasma may be provided by RF power delivered to faceplate 1017 relative to ion suppressor 1023 and/or showerhead 1025. The RF power may alternatively or in combination be applied within RPS 1002. The RF power may be between 10 watts and 10,000 watts, between 10 watts and 5,000 watts, preferably between 25 watts and 2000 watts or more preferably between 50 watts and 1500 watts to increase the longevity of chamber components (e.g. RPS 1002). The RF frequency applied in the exemplary processing system to the remote plasma region (chamber plasma region and/or the RPS) may be low RF frequencies less than 200 kHz, higher RF frequencies between 10 MHz and 15 MHz, or microwave frequencies greater than or about 1 GHz in embodiments. The plasma power may be capacitively-coupled (CCP) or inductively-coupled (ICP) into the remote plasma region.

Excited species derived from the inert gas in RPS 1002 and/or remote chamber region 1015 may travel through apertures in the ion suppressor 1023, and/or showerhead 1025 and react with an oxidizing precursor flowing into substrate processing region 1033 from a separate portion of the showerhead in embodiments. Little or no plasma may be present in substrate processing region 1033 during the remote plasma etch process. Excited derivatives of the precursors and inert gases may combine in the region above the substrate and/or on the substrate to etch structures or remove species from the substrate.

Figure 3B:
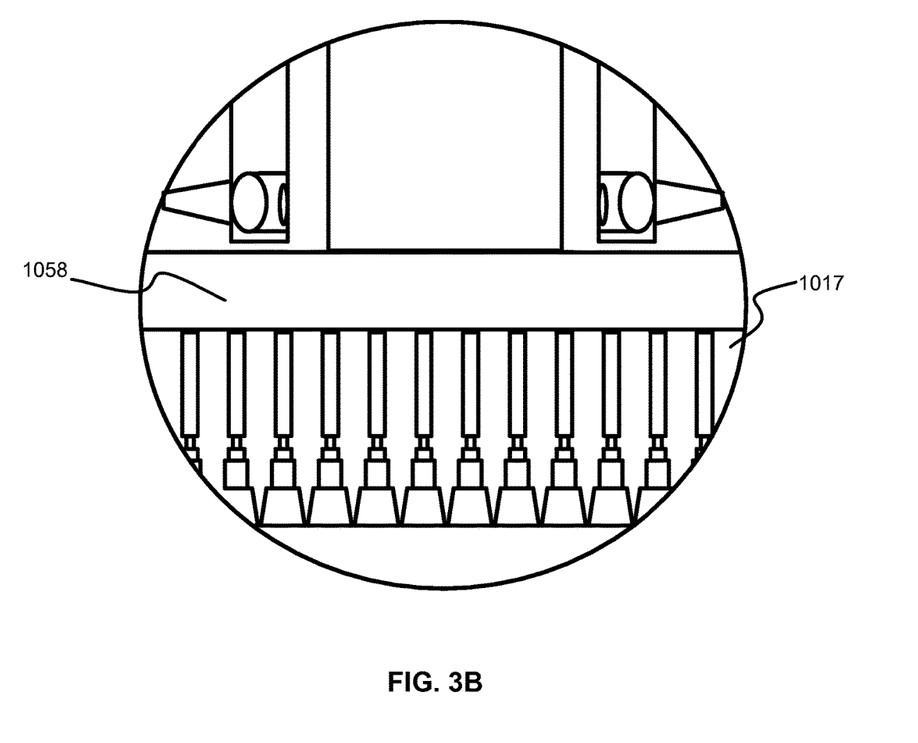
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of substrate processing region 1033 to provide limited interaction with chamber components and each other prior to being delivered into substrate processing region 1033.

Showerhead 1025 may comprise an upper plate 1014 and a lower plate 1016. The plates may be coupled with one another to define a volume 1018 between the plates. The plate configuration may provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025 and used to supply the oxidizing precursor in embodiments. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

In the embodiment shown, showerhead 1025 may distribute via first fluid channels 1019 plasma effluents formed from plasma excitation of the inert gas in remote chamber region 1015. In embodiments, the inert gas introduced into RPS 1002 and/or remote chamber region 1015 may contain be argon.

Figure 3C:
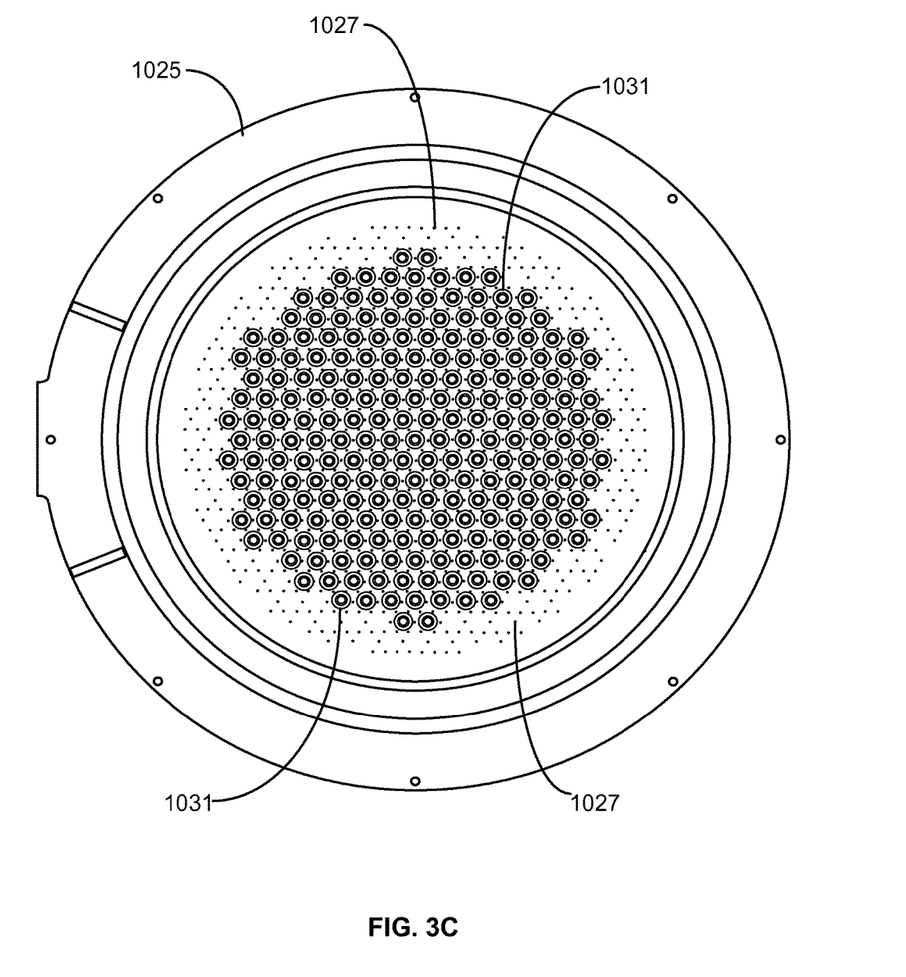
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

The remote chamber region 1015 or a region in an RPS may be referred to as a remote plasma region. In embodiments, the plasma effluents are formed in the remote plasma region and travel into the remote chamber region or the substrate processing region to combine with the oxidizing precursor. In embodiments, the oxidizing precursor is excited only by the plasma effluents. Plasma power may essentially be applied only to the remote plasma region in embodiments to ensure that the plasma effluents provide the dominant excitation.

Figure 4:
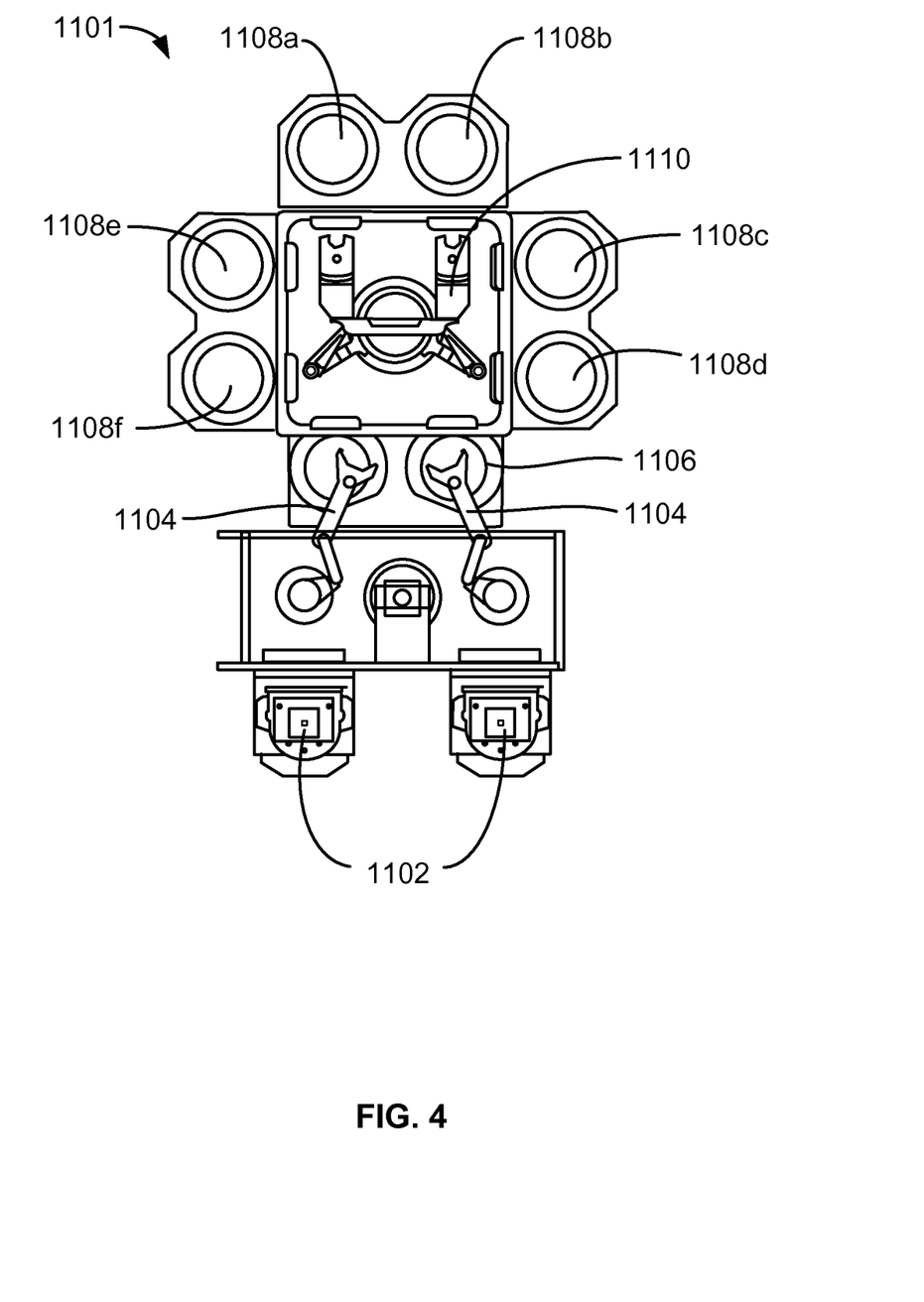
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as, e.g., nitrogen, hydrogen and carbon. In some embodiments, silicon oxide portions etched using the methods disclosed herein consist essentially of silicon and oxygen. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist essentially of silicon and nitrogen. Generally speaking, a first exposed portion of a patterned substrate is etched faster than a second exposed portion. The first exposed portion may have an atomic stoichiometry which differs from the second exposed portion. In embodiments, the first exposed portion may contain an element which is not present in the second exposed portion. Similarly, the second exposed portion may contain an element which is not present in the first exposed portion according to embodiments.

The term "precursor" is used to refer to any chemical which takes part in a reaction to either remove material from or deposit material onto a surface. "Plasma effluents" describe gas exiting from the remote plasma region and entering the remote chamber region and/or the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine precursors" describe radical precursors which contain fluorine but may contain other elemental constituents. "Radical-oxygen precursors" describe radical precursors which contain oxygen but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the claims, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a patterned substrate, the method comprising:
    placing the patterned substrate in a substrate processing region of a substrate processing chamber, wherein the patterned substrate comprises a first exposed portion and a second exposed portion;
    flowing an inert gas into a remote plasma system outside the substrate processing chamber and fluidly coupled to a remote chamber region within the substrate processing chamber;
    forming a remote plasma in the remote plasma system to produce plasma effluents;
    flowing the plasma effluents into the remote chamber region;
    flowing an oxidizing precursor into the remote chamber region; and
    etching the first exposed portion with the combination of the plasma effluents and the inert gas, wherein the first exposed portion etches at a first etch rate and the second exposed portion etches at a second etch rate which is lower than the first etch rate, wherein an electron temperature is less than 0.5 eV in the substrate processing region during the operation of etching the first exposed portion, wherein the remote plasma system contains only inert gases while etching the first exposed portion.

2. The method of claim 1 wherein the inert gas is argon.

3. The method of claim 1 wherein the oxidizing precursor comprises a halogen.

4. The method of claim 1 wherein the oxidizing precursor is not excited in any remote plasma prior to entering the substrate processing chamber.

5. The method of claim 1 wherein the first exposed portion contains at least one element not present in the second exposed portion.

6. The method of claim 1 wherein the first exposed portion and the second exposed portion have differing atomic compositions.

7. The method of claim 1 wherein the oxidizing precursor comprises oxygen.

8. The method of claim 1 wherein the oxidizing precursor comprises one or more of $O_2$, $O_3$, $N_2O$, $H_2O$, $NO_2$ and $N_2O_2$.

9. The method of claim 1 wherein the oxidizing precursor is excited predominantly by the plasma effluents.

10. The method of claim 1 wherein the oxidizing precursor comprises a precursor selected from the group consisting of Cl, $Cl_2$, F, $F_2$, $NF_3$, $CF_4$, HF and $XeF_2$.

11. The method of claim 1 wherein the first etch rate exceeds the second etch rate by a factor of about 80 or more.

* * * * *